United States Patent
Kim et al.

(10) Patent No.: US 7,796,882 B2
(45) Date of Patent: Sep. 14, 2010

(54) IMAGE SENSOR MODULE, METHOD OF MANUFACTURING THE SAME, AND CAMERA MODULE USING THE SAME

(75) Inventors: Ho Kyoum Kim, Suwon-si (KR); Hyoung Woo Nam, Seoul (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 1058 days.

(21) Appl. No.: 11/507,477

(22) Filed: Aug. 22, 2006

(65) Prior Publication Data

US 2007/0047952 A1 Mar. 1, 2007

(30) Foreign Application Priority Data

Aug. 24, 2005 (KR) .............. 10-2005-0077752

(51) Int. Cl.
    *G03B 17/00* (2006.01)
(52) U.S. Cl. ..................................... 396/542
(58) Field of Classification Search ............. 396/542; 348/340

See application file for complete search history.

(56) References Cited

U.S. PATENT DOCUMENTS

| | | | | |
|---|---|---|---|---|
| 6,483,652 | B2* | 11/2002 | Nakamura | ........... 359/819 |
| 6,940,183 | B1* | 9/2005 | Hwan | ........... 257/787 |
| 7,005,310 | B2* | 2/2006 | Hanada et al. | ........... 438/25 |
| 7,589,787 | B2* | 9/2009 | Shinomiya | ........... 348/374 |
| 2004/0234190 | A1* | 11/2004 | Omori | ........... 385/16 |
| 2004/0263668 | A1 | 12/2004 | Kim et al. | |
| 2005/0104186 | A1 | 5/2005 | Yang et al. | |

FOREIGN PATENT DOCUMENTS

| | | |
|---|---|---|
| CN | 1574379 | 2/2005 |
| JP | 11-354769 | 12/1999 |
| JP | 2003-274294 | 9/2003 |
| JP | 2004-56118 | 2/2004 |
| JP | 2005-6279 | 1/2005 |
| JP | 1574379 | 2/2005 |
| KR | 10-2002-0087769 | 11/2002 |
| KR | 10-2004-0027377 | 4/2004 |
| KR | 10-2004-0106661 | 12/2004 |
| KR | 10-2005-0053201 | 6/2005 |

OTHER PUBLICATIONS

Office Action issued in corresponding Chinese Patent Application No. 200610111567.1; mailed on Jun. 6, 2008.
Japanese Office Action issued on Aug. 4, 2009 in corresponding Japanese Patent Application 2006-226948.
Charles A. Harper "Electronic Packaging and Interconnection Handbook" McGraw-Hill, New York, 2000, vol. 3; pp. 1.30 -1.34.
Office Action issued Jan. 9, 2008 in German Patent Application No. 10 2006 038 987.5.

* cited by examiner

*Primary Examiner*—W. B. Perkey

(57) ABSTRACT

The present invention relates to a method of manufacturing an image sensor module including attaching an image sensor on one side of a double-sided flexible printing circuit board (FPCB) provided with a window such that the image sensor module covers the window; and mounting at least one electric part on the other side of the double-sided FPCB on which the image sensor is attached.

14 Claims, 3 Drawing Sheets

[FIG. 1]
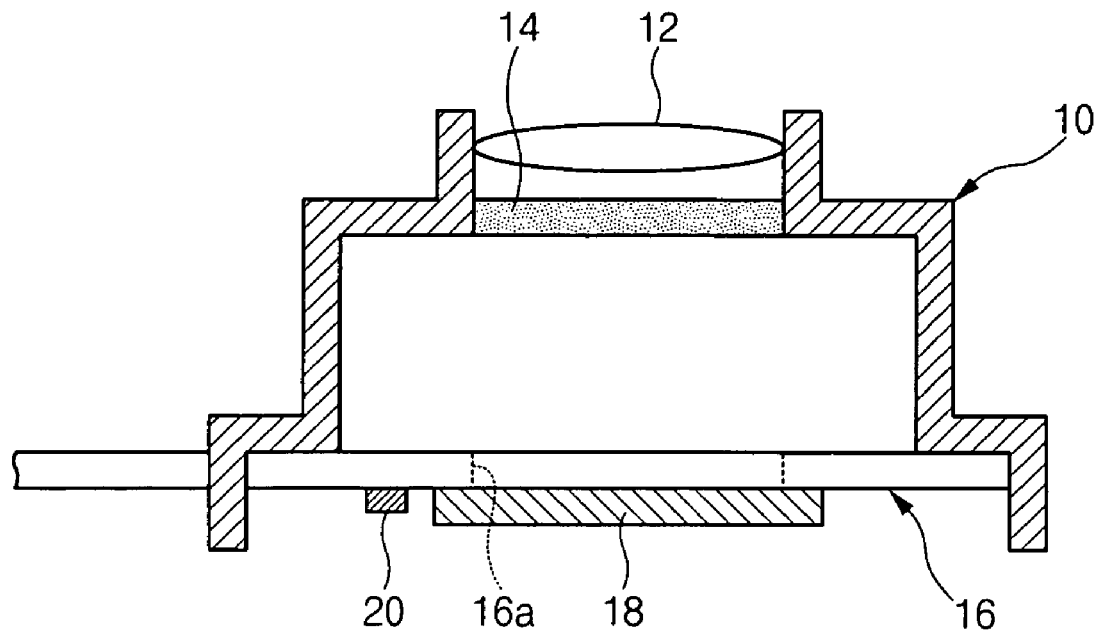
[FIG. 2]
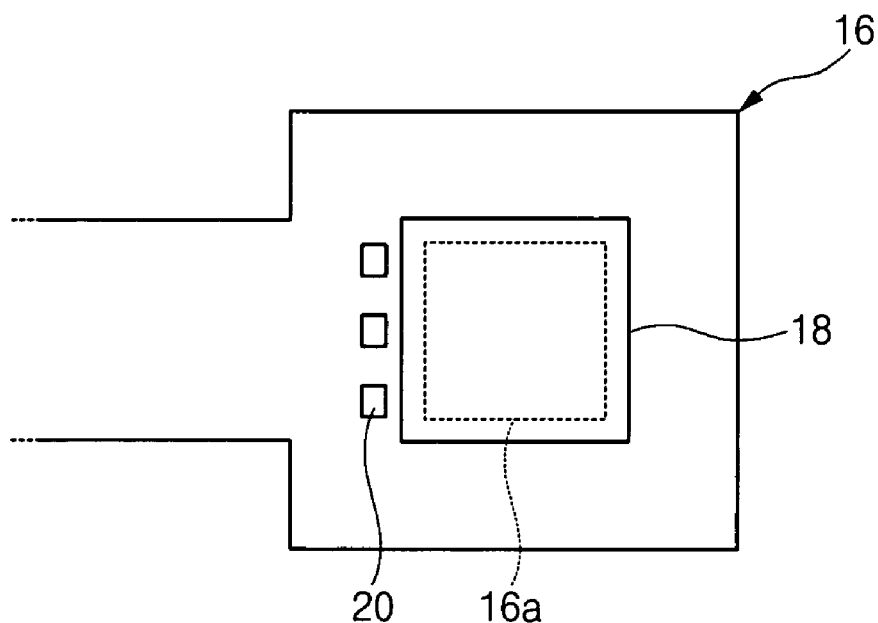

[FIG. 3]
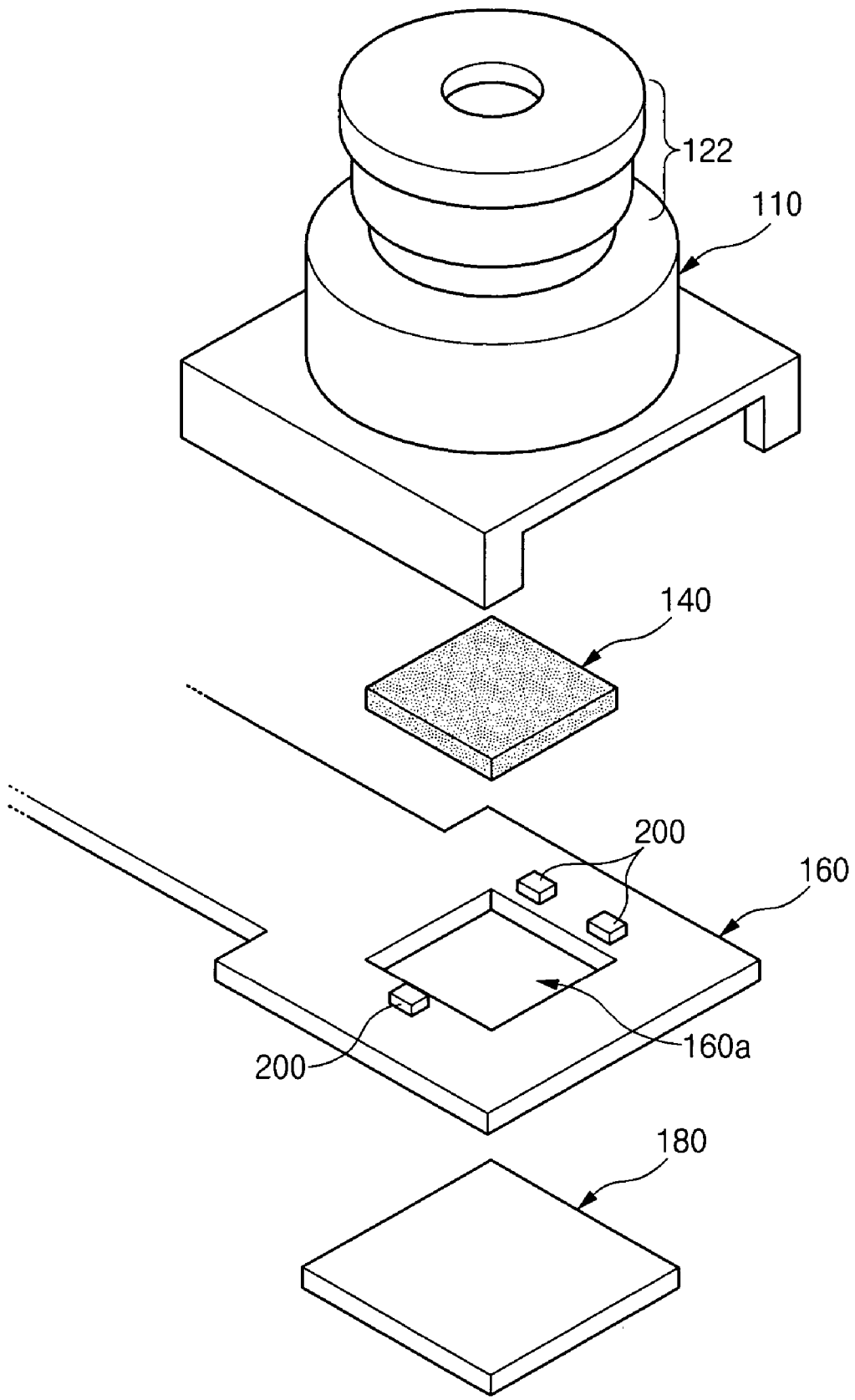

[FIG. 4]
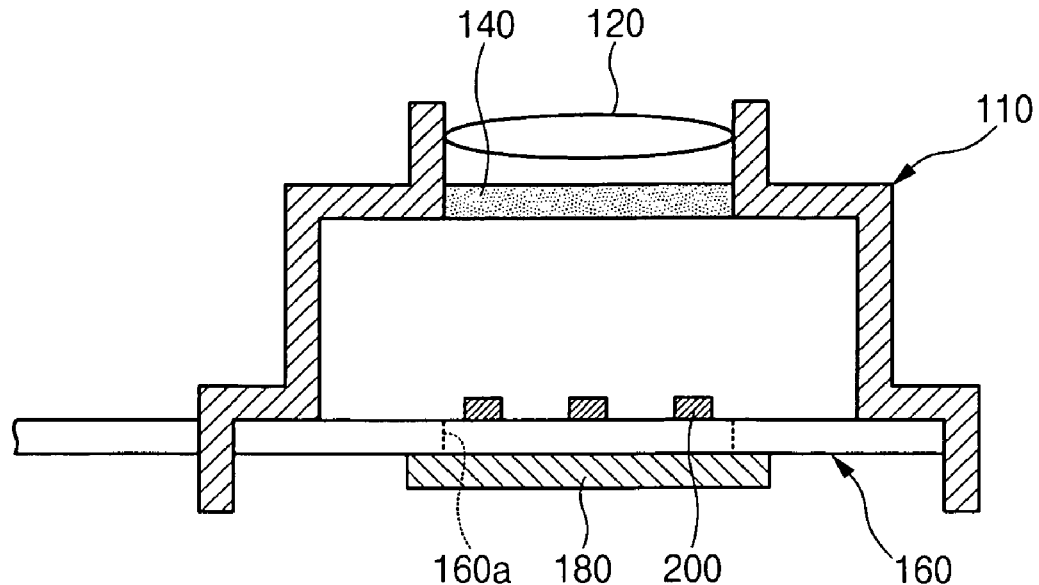
[FIG. 5A]
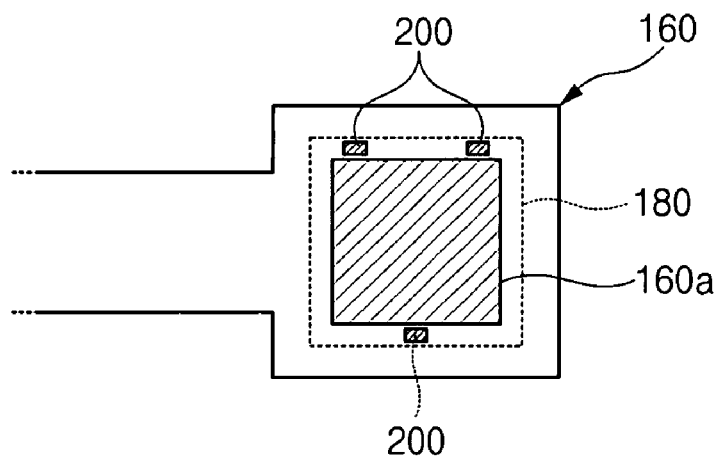
[FIG. 5B]
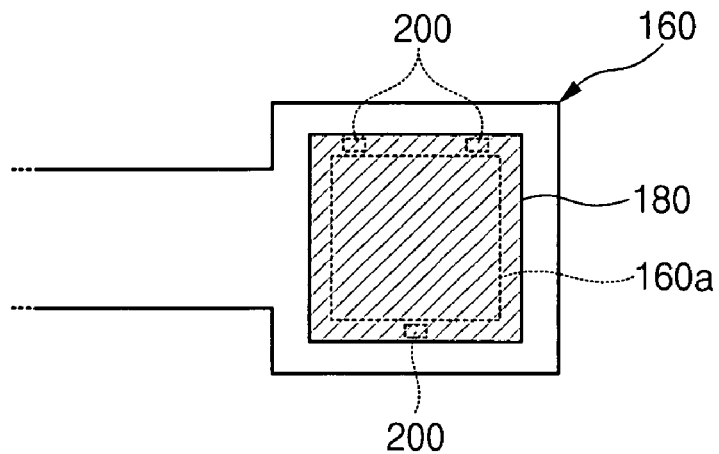

IMAGE SENSOR MODULE, METHOD OF MANUFACTURING THE SAME, AND CAMERA MODULE USING THE SAME

CROSS-REFERENCE TO RELATED APPLICATIONS

The application claims the benefit of Korea Patent Application No. 2005-0077752 filed with the Korea Intellectual Property Office on Aug. 24, 2005, the disclosure of which is incorporated herein by reference.

BACKGROUND OF THE INVENTION

1. Field of the Invention

The present invention relates to an image sensor module, a method of manufacturing the same, and a camera module using the same, in which the size of the camera module is reduced to thereby strengthen competitiveness in cost and product.

2. Description of the Related Art

In general, a ceramic package is packaged by a ceramic material so as to protect a chip such as an IC chip from the outside, and has multiple pins formed outside so as to be fixed to a printed circuit board (PCB). The ceramic package constructed in such a manner serves as a path for emitting heat, protects an IC mounted therein from the external environment, and is sealed so as to endure an external impact. The reason why ceramic is used as a package is that the ceramic has higher heat conductivity than other materials, is not easily deformed by heat, has a dielectric constant favorable for transmitting signals and low dielectric loss as an insulating body, and is chemically stable and excellent in combination with metallic material of wiring pattern.

As a method of packaging an image sensor for camera, there are provided a flip chip chip-on-film (COF) method, a wire bonding chip-on-board (COB) method, a chip scale package (CSP) an the like, among which the COF and COB methods are widely used.

The COB method is a similar process to that of an existing semiconductor production line and has higher productivity than other packaging methods. However, since wire should be used for the connection with a PCB, the size of a module increases and an additional process is needed. Therefore, a new packaging technique is required to reduce the size of chip, to enhance heat emission and electrical performance, and to improve reliability. Accordingly, a COF method has emerged, based on bumps having an external bonding projection.

In the COF method, a space for attaching wire is not needed. Therefore, the area of a package and the height of a lens barrel can be reduced. Further, since a thin film or flexible printed circuit board (FPCB) is used, a reliable package which endures an external impact can be manufactured and the process thereof is relatively simplified. Moreover, the COF method satisfies such a tendency that signals are processed at high speed, high density is required, and multiple pins are needed.

The COF method is implemented as chip size wafer-scale packaging. However, the process cost thereof is expensive, and the correspondence to the due date is unstable. Therefore, the method has a limit as a method for image sensor.

Further, in a module using a mega-quality sensor to which various functions are added, the miniaturization of module, which has been a merit of the COF method, is not realized any more, because of the one-story structure. The module cannot but be designed to have a larger size than in the COB method.

Currently, a double-sided flexible printed circuit board (FPCB) is used so that a module can be designed to have a similar size to that in the COB method, which does not satisfy the miniaturization of module which is a merit of the COF method. Therefore, since the COB method tends to be frequently used, the design and process technique for implementing the miniaturization of module are required.

Then, the conventional image sensor module using the COF method will be described with reference to accompanying drawings, and the problems thereof will be examined.

FIG. 1 is a cross-sectional view illustrating a camera module including the image sensor module according to the related art, and FIG. 2 is a plan view illustrating the image sensor module according to the related art. In the drawings, it is shown that multilayer ceramic capacitors 20 and the image sensor 18 are attached on one side of a flexible printed circuit board (FPCB) 16.

As shown in FIG. 1, the camera module including the conventional image sensor includes a housing 1 having a lens 12 provided in an opening thereof, an IR cut filter 14 which is installed inside the opening of the housing 10 provided with the lens 12, and an image sensor module which is installed inside the housing 10 and is composed of the FPCB 16 having multiple multilayer ceramic capacitors 20 and the image sensor 18 formed on one side thereof. In the image sensor module shown in FIG. 2, a window 16a for transmitting an image signal to the image sensor 18 installed in the opposite side is formed in the FPCB 16, the image signal being transmitted through the lens 12 and the IR cut filter 14. At this time, the image sensor 18 serves to process a received image signal, and the IR cut filter 14 serves to cut infrared rays incident from the outside. Further, the multilayer ceramic capacitors 20 serve to remove screen noise generated in the camera module.

In the conventional image sensor module having such a construction, however, the image sensor 18 is attached on the same surface as the surface of the FPCB 16 on which the multilayer ceramic capacitors 20 are installed. Therefore, the overall size of the image sensor module increases, which is occupied on the FPCB 16.

In the conventional image sensor module, if the camera module is limited to a constant size by the request of a user, an active or passive element including the multilayer ceramic capacitor 20 should be inevitably removed from the image sensor module in order to design a product within the limited size of the camera module. At this time, if the multilayer ceramic capacitor 20 is removed from the image sensor module, screen noise occurs. However, such problems are inevitable in order to reduce the overall size of the camera module including the housing.

Furthermore, when the multilayer ceramic capacitors 20 are installed in the conventional image sensor module in order to remove screen noise, there is a limit in reducing the size of the camera module, because the multilayer ceramic capacitor 20 and the image sensor 18 should be attached on one side of the FPCB 16.

SUMMARY OF THE INVENTION

An advantage of the present invention is that it provides an image sensor module and a camera module using the image sensor module. In the image sensor module, an image sensor is disposed on one side of a double-sided flexible printed circuit board (FPCB) and electric parts such as multilayer ceramic capacitors are disposed on the other side opposite to the side where the image sensor is positioned, thereby reducing the size of the camera module.

Another advantage of the invention is that it provides a method of manufacturing the image sensor module.

Additional aspects and advantages of the present general inventive concept will be set forth in part in the description which follows and, in part, will be obvious from the description, or may be learned by practice of the general inventive concept.

According to an aspect of the invention, a method of manufacturing an image sensor module includes attaching an image sensor on one side of a double-sided flexible printing circuit board (FPCB) provided with a window such that the image sensor module covers the window; and mounting at least one electric part on the other side of the double-sided FPCB having the image sensor attached thereto.

As the electric parts, multilayer ceramic capacitors (MLCC) are used. In mounting the multilayer ceramic capacitors, the multilayer ceramic capacitors are attached through a hardening process after solder cream is coated on portions where the multilayer ceramic capacitors are to be attached.

In mounting the multilayer ceramic capacitors, an anisotropic conductive film (ACF) is inserted between the other side of the double-sided FPCB and the multilayer ceramic capacitors and is then pressed so as to attach the multilayer ceramic capacitors.

In attaching the image sensor, an anisotropic conductive film (ACF) is inserted between the one side of the double-sided FPCB and the image sensor and is then pressed so as to attach the image sensor.

In attaching the image sensor, non-conductive polymer (NCP) is put between the one side of the double-sided FPCB and the image sensor and is then pressurized so as to attach the image sensor.

In attaching the image sensor, an ultrasonic wave is used to attach the image sensor.

According to another aspect of the invention, an image sensor module includes a double-sided flexible printing circuit board (FPCB) having a window formed; an image sensor attached on one side of the double-sided FPCB so as to cover the window; and at least one electric part attached on the other side of the double-sided FPCB having the image sensor attached thereto.

According to a further aspect of the invention, a camera module includes a housing; a lens section mounted in the housing; an IR cut filter mounted in the housing so as to cut infrared rays from the incident light passing through the lens; and an image sensor module composed of a double-sided flexible printing circuit board (FPCB) in which a window for transmitting the incident light passing through the IR cut filter is formed, an image sensor which is attached on one side of the double-sided FPCB so as to cover the window; and at least one electric part which is attached on the other side of the double-sided FPCB having the image sensor attached thereto, the image sensor module being coupled to the housing.

The electric parts are mounted so as to be positioned between the window and the outer perimeter of the image sensor.

The electric parts includes at least one multilayer ceramic capacitor (MLCC).

The image sensor has multiple electrode pads formed on the surface thereof which is attached to the one side of the double-sided FPCB, and bumps are formed in the electrode pads.

The bump is composed of any one of a stud-type bump, a non-electrolytic bump, and an electrolytic bump.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a sectional view illustrating an image sensor according to the related art;

FIG. 2 is a plan view illustrating the image sensor according to the related art;

FIG. 3 is an exploded perspective view illustrating a camera module including an image sensor module according to the present invention;

FIG. 4 is a sectional view illustrating the camera module including the image sensor module according to the invention; and FIGS. 5A and 5B are plan views illustrating the image sensor module according to the invention, respectively seen from one side and the other side thereof.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, preferred embodiments of the present invention will be described in detail with reference to the accompanying drawings.

[Image Sensor Module and Camera Module]

FIG. 3 is an exploded perspective view illustrating a camera module including an image sensor module according to the present invention, FIG. 4 is a cross-sectional view illustrating the camera module including the image sensor module according to the invention, and FIGS. 5A and 5B are plan views illustrating the image sensor module according to the invention, respectively seen from one side and the other side.

As shown in FIGS. 3 and 4, the camera module according to the invention includes a housing 110 having a lens 120 provided in an opening thereof, an IR cut filter 140 which is installed inside the opening of the housing 110 having the lens 120, and the image sensor module which is coupled so as to be disposed in the housing 110. The lens 120, the IR cut filter 140, and the image sensor 180 are positioned on a straight line by reference to the axis of incident light.

The image sensor module includes a double-sided FPCB (Flexible Printing Circuit Board) 160, an image sensor 180 attached on the lower surface of the double-sided FPCB 160, and at least one electric part 200 which is attached on the upper surface opposite to the surface of the double-sided FPCB 160 on which the image sensor 180 is positioned.

In the double-sided FPCB 160, a window 160a is formed, through which the light incident on the lens 120 and the IR cut filter 140 is transmitted to the image sensor 180. Then, the image sensor 180 converts the light into an image signal.

The image sensor 180, which processes the image signal received through the lens 120 and the IR cut filter 140, has a plurality of electrode pads (not shown) formed on the surface attached to one side of the double-sided FPCB 160, each of the electrode pads having a bump. The bump can be composed of any one of a stud-type bump, a non-electrolytic bump, and an electrolytic bump, among which the stud-type bump is preferably used.

The IR cut filter 140 serves to cut infrared rays incident from the outside.

In the electric parts 200, at least one multilayer ceramic capacitor (MLCC) is included. Additionally, other electric parts such as resistor, diode, transistor and the like can be included. Here, the multilayer ceramic capacitor (MLCC) serves to remove screen noise occuring in a camera module, and other electric parts can be used to improve a quality of the camera module.

Meanwhile, a specific relationship between the electric part 200 and the image sensor 180, which are disposed in the double-sided FPCB 160, is shown in FIGS. 5A and 5B. FIG. 5A is a plan view illustrating the image sensor module according to the invention, seen from the inside of the housing. FIG. 5B is a plan view illustrating the image sensor module according to the invention, seen from the outside of the housing. Around the window 160a formed in the double-sided FPCB 160, the electric parts 200 including multilayer ceramic capacitors are mounted on the upper surface of the double-sided FPCB 160, and the image sensor 180 is attached on the lower surface thereof, as described in FIGS. 5A and 5B. Preferably, the electric parts 200 are mounted so as to be positioned inside the surface where the image sensor 180 is attached, that is, between the window 160a and the outer perimeter of the image sensor 180. Accordingly, compared with the conventional image sensor module in which the image sensor is attached on the same surface as the surface of the FPCB on which multilayer ceramic capacitors are installed, the image sensor module can be designed so that the overall size thereof is reduced. As an example, the conventional image sensor module has a size of 6.6×6.6. According to the invention, however, the image sensor module can be designed so as to have a size of 6.0×6.0, which makes it possible to reduce the overall size of the camera module. Further, since the size of the image sensor module according to the invention can be reduced, parts such as chip register for quality improvement can be mounted on the surplus space, in addition to the multilayer ceramic capacitor.

[Method of Manufacturing Image Sensor Module]

A method of manufacturing an image sensor module according to the present invention, that is, a method of attaching the image sensor 180 and the multilayer ceramic capacitors 200 on one side and the other side of the double-sided FPCB 160, respectively, is as follows.

First, as a method of attaching the image sensor 180 on one side of the double-sided FPCB 160, the following methods can be used. A first method is where an anisotropic conductive film (ACF) is inserted between one surface of the double-sided FPCB 160 and the image sensor 180 and is then pressed so as to attach the image sensor 180. A second method is where non-conductive polymer (NCP) is inserted between one surface of the double-sided FPCB 160 and the image sensor 180 and is then pressurized so as to attach the image sensor 180. A third method is where an ultrasonic wave is used to attached the image sensor 180.

Next, as a method of attaching the multilayer ceramic capacitors 200 on the other side of the double-sided FPCB 160, the following methods can be used. A first method is where solder cream is coated on portions where the multilayer ceramic capacitors 200 are to be attached and a hardening process is performed so as to attach the image sensor 180. A second method is where an anisotropic conductive film (ACF) is inserted between the other side of the double-sided FPCB 160 and the multilayer ceramic capacitors 200 and is then pressed so as to attach the image sensor 180. Here, although all the methods can be used in the invention, the method using solder cream is preferably used.

According to the image sensor module, the method of manufacturing the same, and the camera module using the image sensor module, the image sensor is disposed on one side of the double-sided FPCB, and the electric parts such as multilayer ceramic capacitors are disposed on the other side opposite to the one side on which the image sensor is positioned, which makes it possible to reduce the size of the camera module.

Since the camera module can be miniaturized, it is possible to strengthen competitiveness in cost and product.

In the related art where the multilayer ceramic capacitors and the image sensor are disposed in the same direction, epoxy or the like is molded so as to entirely cover the multilayer ceramic capacitors and the image sensor. In the present invention, however, the multilayer ceramic capacitors are disposed in the opposite side to the side where the image sensor is attached. Therefore, molding may be performed so that only the image sensor is covered, which makes it possible to reduce an amount of molding material.

Furthermore, in the conventional image sensor module, only the multilayer ceramic capacitors for removing screen noise can be mounted because of the narrow space. In the present invention, however, other electric parts for improving a quality can be mounted because the space is effectively utilized.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing an image sensor module comprising:

attaching an image sensor on one side of a double-sided flexible printed circuit board (FPCB) provided with a window such that the image sensor module covers the window; and mounting at least one electric part on the other side of the double-sided FPCB having the image sensor attached thereto, and the electric part is mounted so as to be positioned between the window and the outer perimeter of the image sensor.

2. The method of manufacturing an image sensor module according to claim 1, wherein a multilayer ceramic capacitor (MLCC) is used as the at least one electric part and in mounting the multilayer ceramic capacitor the multilayer ceramic capacitor is attached through a hardening process after solder cream is coated on portions where the multilayer ceramic capacitor is to be attached.

3. The method of manufacturing an image sensor module according to claim 2, wherein, in mounting the multilayer ceramic capacitor an anisotropic conductive film (ACF) is inserted between the other side of the double-sided FPCB and the multilayer ceramic capacitor and is then pressed so as to attach the multilayer ceramic capacitor.

4. The method of manufacturing an image sensor module according to claim 1, wherein, in attaching the image sensor, an anisotropic conductive film (ACF) is inserted between the one side of the double-sided FPCB and the image sensor and is then pressed so as to attach the image sensor.

5. The method of manufacturing an image sensor module according to claim 1, wherein, in attaching the image sensor, non-conductive polymer (NCP) is put between the one side of the double-sided FPCB and the image sensor and is then pressurized so as to attach the image sensor.

6. The method of manufacturing an image sensor module according to claim 1, wherein, in attaching the image sensor, an ultrasonic wave is used to attach the image sensor.

7. An image sensor module comprising:

a double-sided flexible printing circuit board (FPCB) having a window formed;

an image sensor attached on one side of the double-sided FPCB so as to cover the window; and at least one electric part attached on the other side of the double-sided FPCB having the image sensor attached thereto, wherein the at least one electric part is mounted so as to be positioned between the window and the outer perimeter of the image sensor.

8. The image sensor module according to claim 7, wherein the at least one electric part includes at least one multilayer ceramic capacitor (MLCC).

9. The image sensor module according to claim 7, wherein the image sensor has multiple electrode pads formed on the surface thereof which is attached to the one side of the double-sided FPCB, and bumps are formed in the electrode pads.

10. The image sensor module according to claim 9, wherein the bumps are composed of any one of a stud-type bump, a non-electrolytic bump, and an electrolytic bump.

11. A camera module comprising:

a housing;

a lens section mounted in the housing;

an IR cut filter mounted in the housing so as to cut infrared rays from the incident light passing through the lens section; and an image sensor module composed of a double-sided flexible printing circuit board (FPCB) in which a window for transmitting the incident light passing through the IR cut filter is formed, an image sensor which is attached on one side of the double-sided FPCB so as to cover the window; and at least one electric part which is attached on the other side of the double-sided FPCB having the image sensor attached thereto, the image sensor module being coupled to the housing, wherein the at least one electric part is mounted so as to be positioned between the window and the outer perimeter of the image sensor.

12. The camera module according to claim 11, wherein the electric part includes at least one multilayer ceramic capacitor (MLCC).

13. The camera module according to claim 11, wherein the image sensor has multiple electrode pads formed on the surface thereof which is attached to the one side of the double-sided FPCB, and bumps are formed in the electrode pads.

14. The camera module according to claim 13, wherein the bumps are composed of any one of a stud-type bump, a non-electrolytic bump, and an electrolytic bump.

* * * * *

UNITED STATES PATENT AND TRADEMARK OFFICE
CERTIFICATE OF CORRECTION

PATENT NO.         : 7,796,882 B2                                          Page 1 of 1
APPLICATION NO.    : 11/507477
DATED              : September 14, 2010
INVENTOR(S)        : Ho Kyoum Kim et al.

It is certified that error appears in the above-identified patent and that said Letters Patent is hereby corrected as shown below:

Column 6, Line 47, delete "part" and insert --part,--, therefor.

Column 6, Line 48, delete "capacitor" and insert --capacitor,--, therefor.

Column 6, Line 54, delete "capacitor" and insert --capacitor,--, therefor.

Signed and Sealed this
Fourth Day of January, 2011

David J. Kappos
*Director of the United States Patent and Trademark Office*